US009659486B2

United States Patent
Weinberg et al.

(10) Patent No.: US 9,659,486 B2
(45) Date of Patent: May 23, 2017

(54) DEVICE AND SYSTEM FOR PROTECTING A PERSON FROM RF RADIATION

(71) Applicants: Martin Weinberg, New Canaan, CT (US); Norman R. Sorensen, Naples, FL (US)

(72) Inventors: Martin Weinberg, New Canaan, CT (US); Norman R. Sorensen, Naples, FL (US)

(*) Notice: Subject to any disclaimer, the term of this patent is extended or adjusted under 35 U.S.C. 154(b) by 38 days.

(21) Appl. No.: 14/323,538

(22) Filed: Jul. 3, 2014

(65) Prior Publication Data
US 2015/0009044 A1 Jan. 8, 2015

Related U.S. Application Data

(60) Provisional application No. 61/842,781, filed on Jul. 3, 2013, provisional application No. 61/938,522, filed on Feb. 11, 2014.

(51) Int. Cl.
| | |
|---|---|
| G08C 19/22 | (2006.01) |
| G08C 17/02 | (2006.01) |
| H04B 1/3827 | (2015.01) |
| G01T 1/02 | (2006.01) |
| G01T 7/00 | (2006.01) |
| G01R 29/08 | (2006.01) |
| G01T 1/17 | (2006.01) |
| G01T 7/12 | (2006.01) |

(52) U.S. Cl.
CPC ........... *G08C 17/02* (2013.01); *H04B 1/3838* (2013.01); *G01R 29/0814* (2013.01); *G01R 29/0857* (2013.01); *G01R 29/0871* (2013.01); *G01T 1/02* (2013.01); *G01T 1/17* (2013.01); *G01T 7/00* (2013.01); *G01T 7/125* (2013.01)

(58) Field of Classification Search
CPC ............ G01R 29/0814; G01R 29/0857; G01R 29/0871; G01R 29/0892; G01T 1/02; G01T 1/17; G01T 1/026; G01T 1/169; G01T 7/00; G01T 7/125
USPC ..................................................... 340/870.07
See application file for complete search history.

(56) References Cited

U.S. PATENT DOCUMENTS

| | | | | |
|---|---|---|---|---|
| 5,235,318 | A * | 8/1993 | Schulcz | G01T 1/02 250/336.1 |
| 5,572,027 | A * | 11/1996 | Tawil | G01T 1/11 250/336.1 |
| 6,031,454 | A * | 2/2000 | Lovejoy | G01T 1/026 250/388 |
| 6,628,201 | B2 * | 9/2003 | Cho | G01T 7/00 250/336.1 |

(Continued)

OTHER PUBLICATIONS

International search report for PCT/US2014/045420 dated Oct. 9, 2014.

*Primary Examiner* — Firmin Backer
*Assistant Examiner* — Adnan Aziz
(74) *Attorney, Agent, or Firm* — O'Shea Getz P.C.

(57) ABSTRACT

A radiofrequency ("RF") transmitter site protection system and an RF radiation protection device are provided. The RF radiation protection device includes a control system and a communication module. The control system includes a processor. The communication module is adapted to communicate with a device operable to sense RF radiation and to receive data representative of a level of the RF radiation proximate the RF safety monitoring device from the RF safety monitoring device.

7 Claims, 4 Drawing Sheets

(56) References Cited

U.S. PATENT DOCUMENTS

| | | | | |
|---|---|---|---|---|
| 6,891,476 B2* | 5/2005 | Kitaguchi | G01T 7/00 340/539.1 |
| 7,147,484 B1* | 12/2006 | Kobayashi | G06F 1/1616 361/679.26 |
| 7,191,097 B1* | 3/2007 | Lee | G06Q 10/06 340/524 |
| 7,994,926 B2* | 8/2011 | Longman | G01T 7/00 250/336.1 |
| 8,289,152 B1* | 10/2012 | Greenberger | H04Q 9/00 340/5.52 |
| 8,769,688 B2* | 7/2014 | Geigel | G06F 11/3006 726/23 |
| 8,841,622 B2* | 9/2014 | Kahilainen | G01T 3/00 250/370.01 |
| 8,912,504 B2* | 12/2014 | Rowlan | G06Q 10/06 250/394 |
| 9,063,233 B2* | 6/2015 | Matsumoto | G01T 7/00 |
| 2002/0180606 A1* | 12/2002 | Kitaguchi | G01T 7/00 340/573.1 |
| 2006/0097171 A1* | 5/2006 | Balchunas | G01T 1/169 250/336.1 |
| 2006/0193288 A1* | 8/2006 | Fano | H04W 8/005 370/328 |
| 2007/0093213 A1* | 4/2007 | Filizola | G01R 29/0814 455/67.16 |
| 2008/0012701 A1* | 1/2008 | Kass | A61B 5/0002 340/539.11 |
| 2010/0029296 A1* | 2/2010 | Noonan | G01S 5/02 455/456.1 |
| 2010/0125438 A1 | 5/2010 | Audet | |
| 2011/0024640 A1* | 2/2011 | Kahilainen | G01T 3/00 250/370.07 |
| 2011/0063127 A1* | 3/2011 | Matsumoto | G01T 7/00 340/870.03 |
| 2011/0163892 A1 | 7/2011 | Groves et al. | |
| 2011/0230171 A1* | 9/2011 | Kasper | G08B 13/2491 455/414.1 |
| 2011/0313651 A1* | 12/2011 | Hyde | G08B 3/10 701/400 |
| 2012/0154170 A1* | 6/2012 | Kahilainen | H04Q 9/00 340/870.02 |
| 2012/0317267 A1* | 12/2012 | Herrod | H04W 64/00 709/224 |
| 2013/0320212 A1* | 12/2013 | Valentino | G01J 1/0488 250/336.1 |
| 2014/0256375 A1* | 9/2014 | Park | H04M 1/24 455/550.1 |

* cited by examiner

DEVICE AND SYSTEM FOR PROTECTING A PERSON FROM RF RADIATION

This application claims the benefit of U.S. Provisional Patent Application Ser. No. 61/842,781 filed Jul. 3, 2013, and U.S. Provisional Patent Application Ser. No. 61/938,522 filed Feb. 11, 2014, wherein the subject matter of both aforesaid applications is hereby incorporated by reference herein.

BACKGROUND OF THE INVENTION

1. Technical Field

Aspects of the present invention relate to devices, systems, and methods for protecting humans from Radio Frequency (RF) radiation (e.g., RF signals transmitted by cellphone towers, etc.) and damage associated therewith.

2. Background Information

Mobile communication devices are proliferating, and the demand for high-speed wireless network connectivity is expanding. In the United States RF cellular antenna transmitters, both governmental and commercial, now exceed 600,000 and that number is expected to double by 2016. The total number of cellular antenna transmitters worldwide is estimated at six million and is growing rapidly. The vast majority of cellular antenna transmitters used in the U.S. are located on commercial or municipal building rooftops (e.g., in church steeples, on water towers, etc.).

Cellular antennas transmit RF signals in the frequency range of 800 MHz to 2100 MHz. These RF signals are suspected to cause physical, cognitive and mental damage to humans who venture within close proximity to the source of the signals. For example, current understanding is that over-exposure to RF radiation can cause thermal injuries and specific medical conditions, including cognitive disorders, memory lapses, headaches, attention disorders and other long-term effects. Regulatory agencies, including FCC, OSHA and ICNIRP (International Commission on Non-Ionizing Radiation Protection) and others, have promulgated RF radiation safety and health rules, guidelines, and standards that are specific to RF radiation from cell antennas. These rules, guidelines, and standards are not always enforced. These same regulatory agencies have set what they claim are "safe levels" of radiation exposure, but there are a growing number of doctors, physicists, municipal authorities, and health officials who strongly disagree with what are actually "safe levels", and foresee a public health crisis.

The safety of RF cellular antenna transmitters is the subject of extensive scientific debate. There is a growing body of scientific evidence that indicates that the electromagnetic radiation emitted by cell tower antennas, even at low levels, can be dangerous to human health. Studies have shown that even at low levels of this RF radiation, damage to cell tissue and DNA may occur, and that damage may be linked to brain tumors, cancer, suppressed immune function, depression, miscarriage, Alzheimer's disease, and numerous other serious illnesses.

Humans directly impacted by the effect of RF cellular antenna transmitters exposure include third-party workers such as painters, roofers, carpenters, HVAC technicians, electricians and others who are obligated to perform their standard duties within the "restricted" and/or "controlled" areas (as defined by FCC, and/or ICNIRP, OSHA and others) of these RF antennas. Employees of FCC licensees who maintain the antennas are usually protected by protocols in which their employer (FCC licensee) may power-down the antennas for protection of their workers. However, third party workers who are also compelled to work within a restricted and/or controlled area of an RF antenna are usually not afforded such protection. In fact, it appears that often these third-party workers or contractors are not aware that exposure to cell antenna RF radiation may cause physical, cognitive and mental damage. It is also possible that individuals who are unrelated to work or maintenance functions may enter such restricted and/or controlled areas.

RF safety monitoring devices are typically calibrated to measure RF exposure as a percentage of the two most common international RF safety guidelines: International Commission on Non-Ionizing Radiation Protection (ICNIRP) guidelines and the U.S. Federal Communications Commission (FCC). The ICNIRP guidelines are also endorsed by the World Health Organization. RF safety monitoring devices are often used by personnel working in environments where high levels of RF radiation may be present; e.g., an RF signal transmission source such as a telecommunication tower, or on a building rooftop with a transmitting antenna, etc.

SUMMARY OF THE INVENTION

According to an aspect of the present invention, a radiofrequency radiation protection device ("RFPD") is provided that includes a control system and a communication module. The control system includes a processor. The communication module is adapted to communicate with a device operable to sense radiofrequency radiation ("RF safety monitoring device") and to receive data representative of a level of the radiofrequency (RF) radiation proximate the RF safety monitoring device from the RF safety monitoring device.

In an embodiment of the foregoing aspect the communication module is adapted to communicate with the RF safety monitoring device using wireless communications.

In a further embodiment of any aspect or embodiment above, the communications module is further adapted to send and receive communications with a unit independent of the RFPD, other than the RF safety monitoring device.

In a further embodiment of any aspect or embodiment above, the communication module is adapted to communicate a unique identifier associated with the RFPD to the independent unit.

In a further embodiment of any aspect or embodiment above the RFPD further includes a global positioning system sensing device.

According to another aspect of the present invention, a radiofrequency radiation protection device ("RFPD") is provided that includes a control system and a communication module. The control system includes a processor and is adapted to sense RF radiation and to produce data representative of a level of the RF radiation. The communication module is operable to transmit the data representative of the level of sensed RF radiation to a unit independent of the protection device.

In an embodiment of foregoing aspect, the communications module is further adapted to send and receive communications with a unit independent of the RFPD.

In a further embodiment of any aspect or embodiment above, the communication module is further adapted to communicate with the independent unit using wireless communications.

In a further embodiment of any aspect or embodiment above, the communications module is adapted to communicate a unique identifier associated with the RFPD to the independent unit.

In a further embodiment of any aspect or embodiment above, the RFPD further includes a GPS locator operable to determine a location of the RFPD. The term "GPS locator" as used herein refers to any device operable to communicate with global positioning system satellites to determine position data.

In a further embodiment of any aspect or embodiment above, the RFPD control system is adapted to access a database containing RF transmitting site locations, and to determine a distance between the RFPD and at least one of the RF transmitting site locations contained within the database.

According to another aspect of the present invention, a portable communication device is provided that includes a control system and a communication module. The control system includes a processor adapted to sense RF radiation and to produce data representative of a level of the RF radiation. The communication module is operable to transmit the data representative of the level of sensed RF radiation to a unit independent of the portable communication device.

In a further embodiment of the foregoing aspect, the portable communication device is in the form of a cellphone, a computer, a tablet, or a smart device.

According to another aspect of the present invention, a radiofrequency transmitting site protection system is provided. The system includes a plurality of radiofrequency protection devices ("RFPDs") and at least one unit independent of the RFPDs. The RFPDs each have a control system, including a processor, and a communication module adapted to communicate with a device operable to sense RF radiation ("RF safety monitoring device") and to receive data representative of a level of the RF radiation proximate the RF safety monitoring device from the RF safety monitoring device. The at least one unit independent of the RFPDs includes a control system having a processor, and a communication module adapted to communicate with the RFPDs, wherein the control system is adapted to store data representative of the RF radiation level proximate the RF safety monitoring device.

According to another aspect of the present invention, a radiofrequency ("RF") transmitting site protection system is provided. The system includes at least one radiofrequency radiation protection device ("RFPD") and at least one unit independent of the RFPD. The RFPD has an RFPD control system, including a processor, a device operable to sense RF radiation ("RF safety monitoring device"), and an RFPD communication module. The at least one unit independent of the RFPD includes a unit control system having a processor, and a unit communications module adapted to communicate with the RFPD. The RFPD communication module is adapted to communicate with the independent unit, including transmitting data representative of a level of the RF radiation proximate the RFPD. The unit control system is adapted to store data representative of the RF radiation level proximate the RFPD, and to communicate with the RFPD.

In an embodiment of foregoing aspect, the unit control system is adapted to store RF radiation levels proximate the RFPD as a function of time.

In a further embodiment of any aspect or embodiment above, the unit control system is adapted to determine at least one of a duration of continuous RF radiation exposure proximate the RFPD or a total amount of time of RF radiation exposure proximate the RFPD within a given time period.

In a further embodiment of any aspect or embodiment above, the RFPD includes a GPS locator operable to determine a location of the RFPD.

In a further embodiment of any aspect or embodiment above, the unit control system is adapted to access a database containing RF transmitting site locations, and to determine a distance between the RFPD and at least one of the RF transmitting site locations contained within the database using the GPS determined location of the RFPD.

In a further embodiment of any aspect or embodiment above, the at least one unit independent of the RFPD includes an on-site unit located at an RF transmitting site, and a base unit located remote from the RF transmitting site. The RFPD communication module is adapted to communicate with the on-site unit, including transmitting data representative of a level of the RF radiation proximate the RFPD to the on-site unit. The on-site communications module is adapted to communicate with a base unit communications module, including transmitting data representative of a level of the RF radiation proximate the RFPD to the base unit. At least one of an on-site control system or a base unit control system is adapted to store data representative of the RF radiation level proximate the RFPD.

In an embodiment of the foregoing aspect, the on-site communications module is adapted to communicate a unique identifier associated with the on-site unit to the base unit.

DETAILED DESCRIPTION

Figure 1:
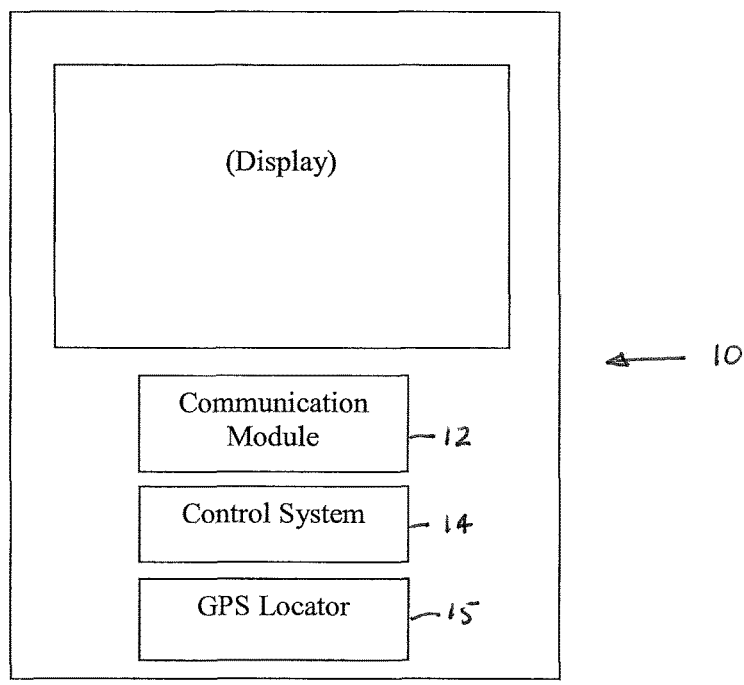
FIG. 1 is a diagrammatic depiction of an RFPD embodiment.

According to an aspect of the present invention, a user RF radiation protection device ("RFPD") 10 is provided that is portable and therefore can be conveniently carried by a user. As is diagrammatically shown in FIG. 1, the RFPD 10 includes a communication module 12 that is operable to receive and transmit information as will be described below, and a control system 14.

The RFPD control system 14 can be used to control the operations described in association with any of the computer-implemented methods described herein. The control system 14 typically includes a processor and a memory, and in some embodiments may further include a storage device. In some embodiments, the control system 14 may further include an input/output device (e.g., one or more of a keypad, a graphic user interface—a "GUI", and a display). The processor is capable of processing instructions for execution within the system. The memory stores information within the system. In general, the storage device can include any non-transitory tangible media configured to store computer readable instructions. The input/output device provides input/output operations for the system. Examples of input/output devices that may be included in the RFPD 10 include a keypad, a touch screen, a display, etc. The control system 14 can be implemented in digital electronic circuitry, or in computer hardware, firmware, or in combinations of them.

Figure 2:
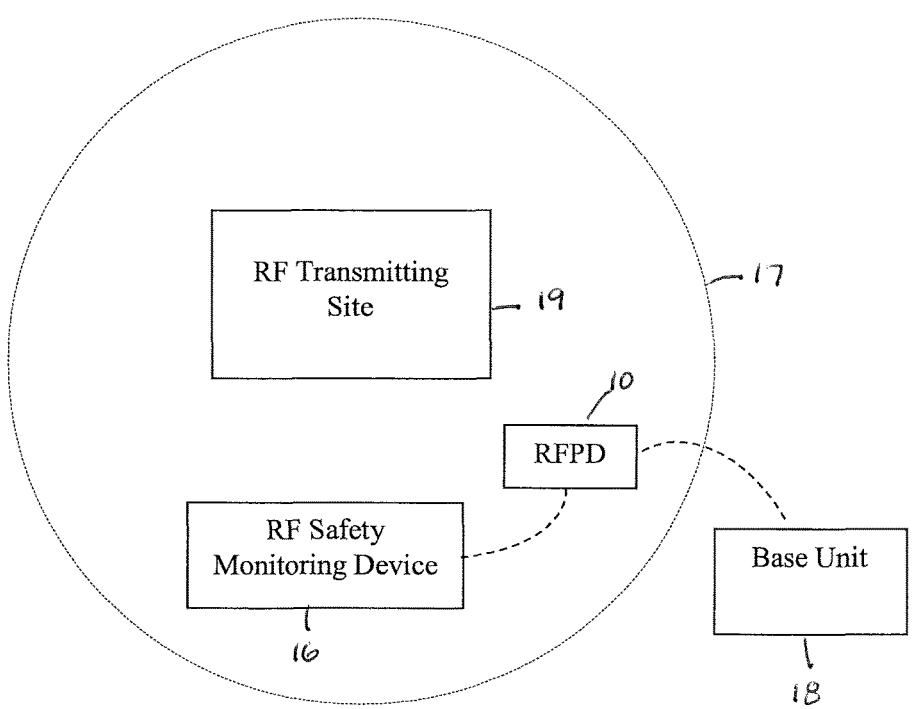
FIG. 2 is a diagrammatic depiction of another RFPD embodiment.

Referring to FIG. 2, in some embodiments the RFPD communication module 12 is adapted to receive RF radiation information (e.g., by wired connection, or in wireless form such as via Bluetooth, or other electronic signal transmission technologies) from an RF safety monitoring device 16. The term "RF safety monitoring device" as used herein refers to a device operable to detect RF radiation in proximity to the device. For purposes of illustration, a dotted ring 17 is shown around the RF transmitting site 19 in FIGS. 2, 4, and 5 to diagrammatically show proximity. The RFPD communication module 12 may also be adapted to communicate with other devices. For example and as will be described in more detail below, the RFPD communication module 12 may be adapted to communicate with a base unit 18 or other type unit, which unit is independent of the RFPD 10 and is typically located remote from the RFPD 10. The RFPD 10 and unit 18 may form part of a RF transmitter site protection system 20 (also referred to as an "SPS") as will be described below. The communications between the RFPD 10 and the unit 18 may be accomplished by cellular phone type communications (e.g., via a cellular network) or other wireless communications. In those instances where the RFPD 10 communicates with an independent unit (e.g., a remotely located base unit 18), the RFPD communication module 12 may include a unique identifier (e.g., a unique digital signature) associated with the particular RFPD 10 to enable the communications to be attributed to that particular RFPD 10.

In some embodiments, the RFPD 10 may be independent of the RF safety monitoring device 16. In these instances, the RF safety monitoring device 16 may be a portable device (e.g., in a size that can be conveniently carried by a user), or the RF safety monitoring device 16 may be in a form that is intended to be permanently mounted at an RF transmitting location. In both instances, the RFPD 10 is adapted to communicate with the RF safety monitoring device 16. The communications between RFPD 10 and the RF safety monitoring device 16 may include information such as the presence or absence of RF radiation, the strength of the radiation, etc.

Figure 3:
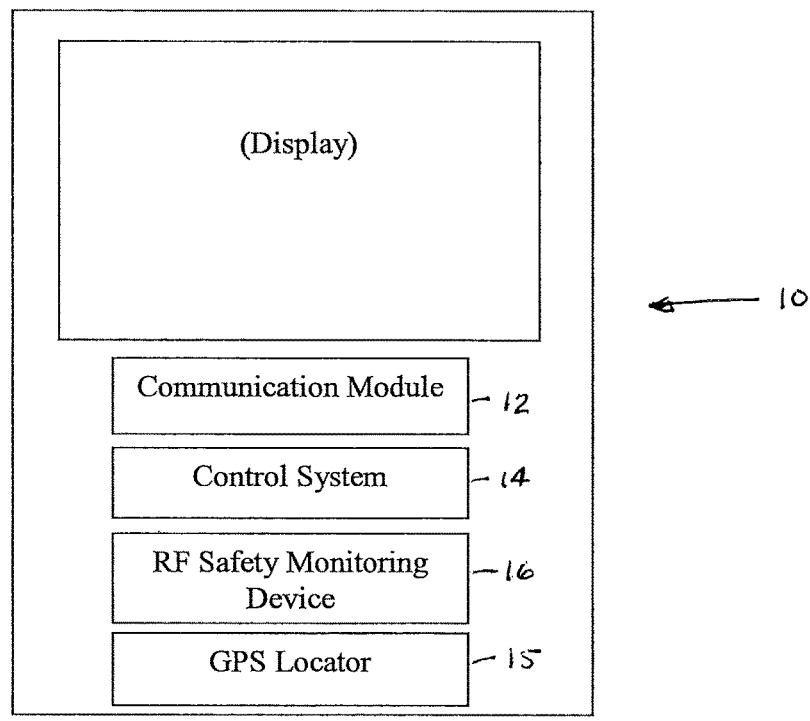
FIG. 3 is a diagrammatic depiction of an RFPD and an RF safety monitoring device relative to a RF transmitting site.
Figure 4:
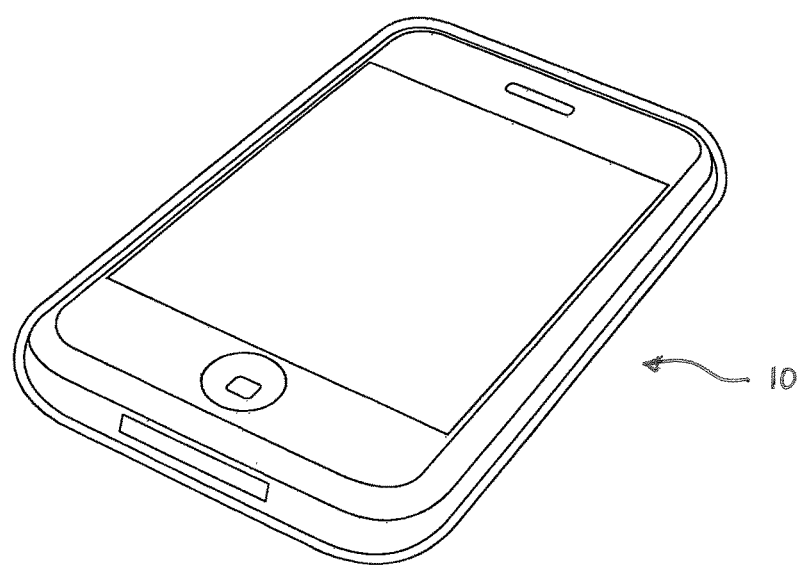
FIG. 4 is a diagrammatic depiction of an RFPD embodiment, in the form of a cellphone.

Referring to FIGS. 3 and 4, in some embodiments the RFPD 10 may have an RF safety monitoring device 16 incorporated directly into the RFPD 10; e.g., the RF safety monitoring device 16 is a module within the RFPD 10. For example, a device capable of transmitting communication signals such as a cellphone, a smart device, a tablet, a computer, or the like may include an RF safety monitoring device 16. The phrase "transmitting communication signals" refers to the transmission of signals that carry or can be interpreted to provide information. A non-limiting example of such communications signals are those used in cellular communications. It should be noted that the terms "cellphone", "smart device", "tablet", "computer" etc., have evolving definitions as the functional capabilities of such devices grow and change with technology developments. In addition, new devices (e.g., "Google™ Glasses") periodically come to market that include similar or new functionality packaged in a new format. The RFPD 10 described herein that includes an RF safety monitoring device 16 may assume any of these product formats or formats not yet available. To facilitate description of this aspect of the present invention (i.e., wherein an RFPD 10 includes a RF safety monitoring device 16), however, the term "cellphone" as used hereinafter is intended to refer to any of these type devices, unless otherwise indicated. In these embodiments, the RF safety monitoring device 16 is in communication (e.g., by hardwire connection, printed circuit board, etc.) with the other elements within the RFPD 10. A cellphone that includes the RF safety monitoring device 16 may be referred to as an RFPD 10. Also in these embodiments, the wireless communications capability of the cellphone (e.g., cellular communications, internet connectivity, email connectivity, messaging capability, etc.) can provide the RFPD communication module 12. The RF safety monitoring device 16 can be configured (e.g., "tuned") to detect RF radiation at particular wavelengths and/or above certain power levels.

In those instances where a cellphone may be configured to function as an RFPD 10, the cellphone may be adapted to include a software application (e.g., an "APP") operable to operate the control system (e.g., processor, etc.) of the cell phone. The APP adapts the cellphone to provide some or all of the functionality described herein; e.g., determine (e.g., using GPS input) the positioning of the cellphone relative to an RF transmitting site 19, and/or to access a database containing known RF transmitting sites 19 and their locations, etc. The APP can determine the distance between the cellphone and the RF transmitting site (e.g., using GPS and the database) and inform the cellphone user of that distance.

The APP may further adapt the cellphone to send the sensed data (e.g., RF radiation level, time of exposure to RF radiation, etc.) to a base unit 18 (or on-site unit 22). The APP may further adapt the cellphone to receive communications (e.g., call or text) from a unit 18, 22, including information such as a message that the RFPD user has entered an RF radiation area, or collective information from the unit 18, 22 such as total exposure time within a given monitoring period, or an indication that the RFPD user has exceeded a permissible total time during the monitoring period, etc. The APP may provide redundant warnings and information concerning dangerous locations, precautions and emergency contact information. Indications (e.g., warnings, etc.) may increase with intensity (e.g., louder audible, etc.) as RF radiation levels increase.

In some embodiments, the RFPD 10 may be connectable to an independent RF safety monitoring device 16; e.g., by hardwire via a USB port, or the like.

The RFPD control system 14 may be configured to enter an "active state" automatically upon receipt of a signal from the RF safety monitoring device 16 (or integral module) indicating that RF radiation above a certain level has been sensed. Once in the active state, the RFPD control system 14 may display of pertinent information (e.g., RF radiation level, cumulative exposure time, etc.) and/or activate an alarm as described below. In addition, in those embodiments that include a communications capability with an independent unit 18, 22, the RFPD 10 may upon entering the active state provide the aforementioned information to an independent unit 18, 22; e.g., signal the independent unit 18, 22 that the RFPD 10 (identified by its unique identifier) has detected a particular RF radiation level, etc.

The RFPD control system 14 may be adapted to process the information received from the RF safety monitoring device 16. For example, the processor within the RFPD control system 14 may receive the detected radiation information and process that information using one or more programmed algorithms. The algorithms can, for example, make a determination regarding the strength of the detected RF radiation relative to a predetermined acceptable exposure level. The control system 14 can then display information (either automatically or on request) indicative of whether the present RF radiation exposure is below or above predetermined safety thresholds. As another example, the RFPD control system 14 may be adapted (e.g., via programming) to store periodically acquired RF radiation exposure levels and determine temporal RF exposure values, such as the duration of RF exposure on a given day, how many days the user was exposed in a given month, the total number of exposure hours in a given month, etc. The control system 14 can provide the user (automatically or on request) information regarding the user's cumulative RF radiation exposure for the period of time. The ability to track a user's accumulated RF radiation exposure is important due to the cumulative effects of RF radiation exposure. The RFPD control system 14 may be configured so that the cumulative RF radiation exposure data can be selectively reset; e.g., after the cumulative data is transferred to an independent unit 18, 22, or at the start of a new monitoring period, etc. In all instances, the control system may provide a warning (e.g., audible, vibration, visual, etc.) to the RFPD 10 user regarding the present RF radiation level or regarding the user's cumulative RF radiation exposure within the period of time; e.g., if the RF radiation level or the cumulative RF exposure exceeds the predetermined safety thresholds.

The RFPD 10 may include, or be configured to connect with, a GPS locator 15 operable to determine where the RFPD 10 is located. As will be explained below, the GPS locator 15 can be used to determine the distance between a RFPD 10 and a known RF transmitting site 19. In those embodiments where the RFPD 10 is a cell phone, the GPS capability within the cellphone can be used as a GPS locating module portion of the RFPD 10.

In some embodiments, the RFPD control system 14 may be adapted to enable a determination of the position of a user relative to an RF transmitter site 19 using a database that contains a listing of RF transmitter site 19 locations. The RFPD control system 14 may be adapted with the database or the database may be a third party database accessible by the RFPD control system 14. The RFPD control system 14 may be adapted to permit a user to input a user's location, or to determine the RFPD's location (and therefore the RFPD user's location), for example by GPS, and subsequently access the database to determine the presence or absence of an RF transmitter site 19 relative to the user's location. The comparison of the RFPD 10 location and the RF transmitter site 19 locations within the database will penult a pairing of an RFPD 10 with a specifically identified RF transmitter site 19. The RFPD control system 14 can then record information such as identification of the particular RF transmitter site 19, the time and date when the RF exposure occurred, the duration of RF exposure, and the level of RF radiation to which the RFPD 10 (and therefore the associated user) was exposed, etc.

The RFPD 10 may also include communication capability (e.g., a built-in headset), which allows the user to communicate with other users using an RFPD 10 at a given site 19, or in a given area or region.

In some embodiments, the RFPD 10 may be adapted for use with RF radiation protective equipment (e.g., head protective gear, or protective garments, etc.). In these instances, the RFPD 10 may be adapted to sense if the protective gear is present on the user (e.g., the protective gear may include an RFID tag, or an ultrasonic tag that can be sensed by the RFPD 10) and record whether the RFPD user is using the RF radiation protective equipment.

According to another aspect of the present invention, one or more RFPDs are used in combination with one or more independent units 18, 22 as part of an RF transmitting site protection system 20 ("SPS"). As indicated above, RF radiation produced at an RF transmitter site 19 may cause harmful health effects to people in close proximity. It is important that an entity operating an RF transmitter site 19 monitor the site to minimize or avoid activity that may result in such harmful health effects. Moreover, it is useful for an entity operating an RF transmitter site 19 to monitor the site to establish appropriate safety measures are in place.

Figure 5:
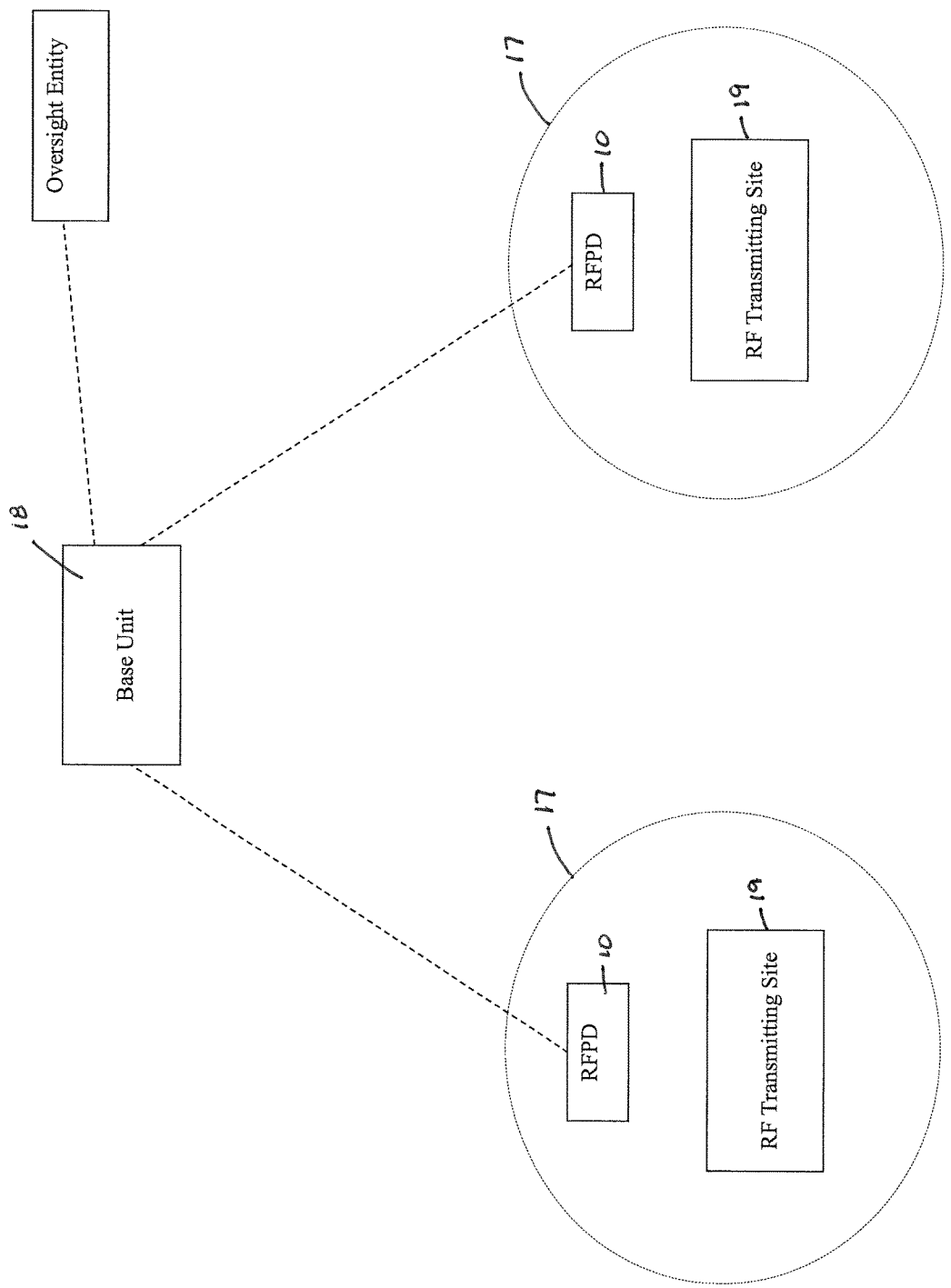
FIG. 5 is a diagrammatic depiction of an RF transmitting site protection system embodiment.

Referring to FIG. 5, in a first embodiment the SPS 20 includes one or more independent units 18 (referred to hereinafter as "base units" that are operable to communicate with RFPDs 10. The base unit 18 may include a control system and a communication module compatible with and similar to the RFPD control system 14 and communication module 12 described above. In this embodiment, the base unit control system is adapted to receive communications directly from the one or more RFPDs 10. The information received from an RFPD 10 may be unprocessed, partially processed or completely processed by the RFPD control system 14. For example, the information communicated by the RFPD 10 to a base unit 18 may be in a form similar to that collected by a RF safety monitoring device 16, in which case the RFPD 10 acts as a relay sending the information to the base unit 18 where the information may be further processed. As another example, the information communicated by the RFPD 10 to a base unit 18 may be partially processed by the RFPD control system 14; e.g., the RFPD control system 14 may compare the RF radiation levels detected an RF safety threshold, but cumulative RF exposure data is not processed within the RFPD control system 14. In this example, the RF exposure data may be processed to determine the cumulative RF exposure data within the base unit 18. As yet another example, the information communicated by the RFPD 10 to a base unit 18 may be completely processed; e.g., the RFPD control system 14 may process detected RF radiation levels relative to RF safety thresholds, and also determine cumulative RF exposure data. The processed data can then be communicated to a base unit 18 where it is stored. The present invention is not limited to these examples, and considers permutations thereof. The communications from each RFPD 10 may include the unique identifier of the RFPD 10 and information indicating the identity of the RF transmitting site 19 that is sensed by the RFPD 10; e.g., by GPS information, or by the RF transmitter site database, etc.

Figure 6:
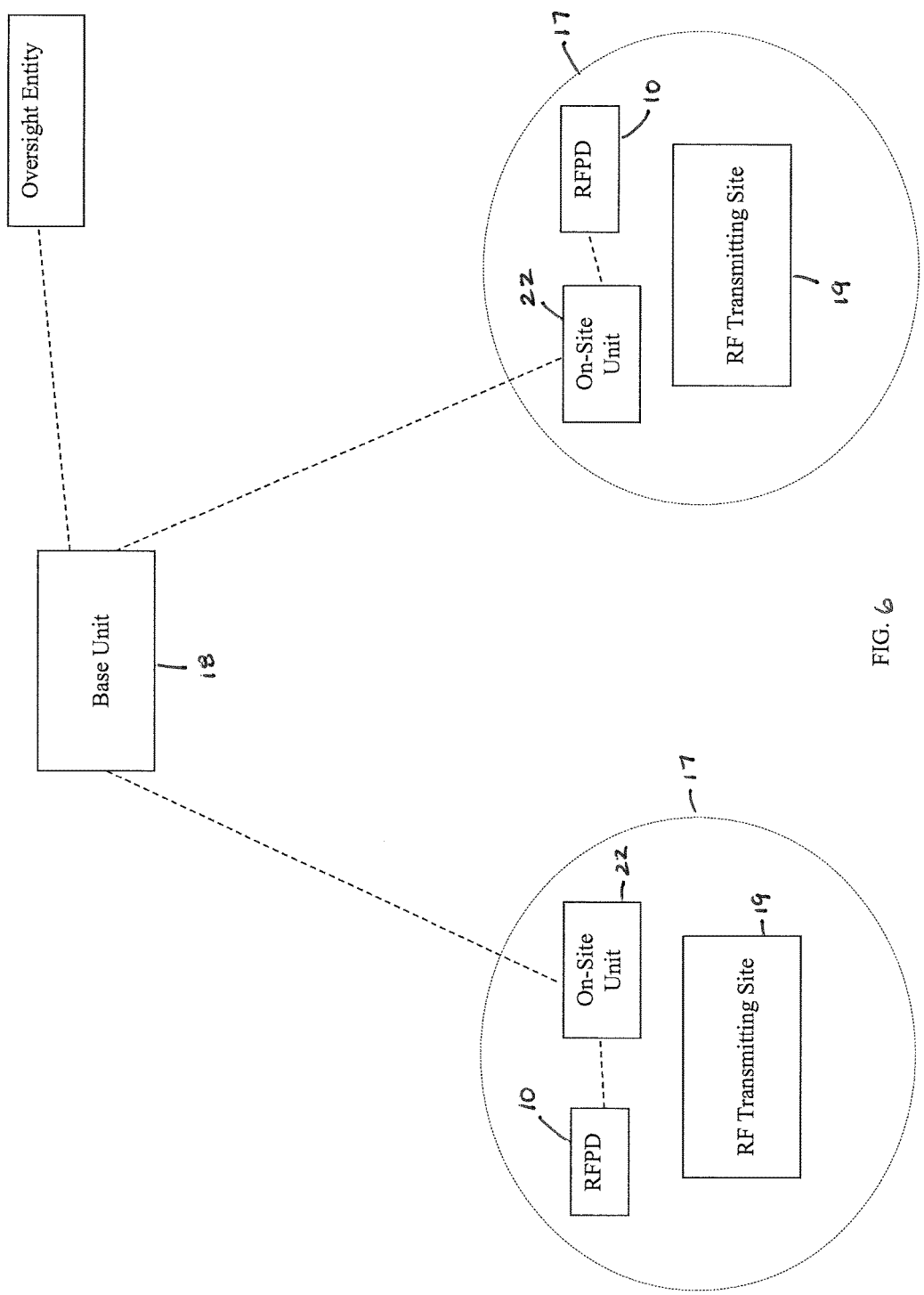
FIG. 6 is a diagrammatic depiction of another RF transmitting site protection system embodiment.

Referring to FIG. 6, in an alternative embodiment the SPS 20 includes one or more independent units (referred to hereinafter as "on-site units 22") that are operable to communicate with RFPDs 10, and one or more base units 18 that are in communication with the on-site units 22. In this embodiment, each on-site unit 22 is located at a particular RF transmitting site 19. An RFPD 10 in use at an RF transmitting site 19 may communicate with the on-site unit 22, and the on-site unit 22 may in turn communicate with the base unit 18. The specific nature of the information communicated may take various forms as is explained above and below. If there is more than one base unit 18 within the SPS 20, a particular on-site unit 22 may communicate with all of the base units 18, or may be programmed to communicate with a particular base unit 18. In some instances, the on-site unit 22 may receive the communications from an RFPD 10, package the information in a form that can be received by a base unit 18, and add to the communications a unique identifier associated with the RF transmitting site 19 (e.g., a unique identifier that identifies the on-site unit 22, which in turn can be used to identify the RF transmitting site 19) prior to sending the communications to the base unit 18. The proximity of the on-site unit 22 to an RFPD 10 located at the RF transmitting site 19 can facilitate communications with the RFPD 10, and provide the RF transmitter site 19 unique identifier without the need to access GPS or database information. In this embodiment, the on-site unit 22 may have a communication module and control system compatible with and similar to that of the base unit 18, or may be simplified relying upon the base unit control system to process RF exposure data based on the information originating from the RFPD 10.

The information received directly (or indirectly via an on-site unit 22) at the base unit 18, will include the RF radiation exposure information received from the RFPD 10; e.g., the time and date when the RF exposure occurred, the duration of RF exposure, and the level of RF radiation to which the RFPD 10 was exposed occurred. Alternatively, the RF radiation exposure transmitted from the RFPD 10 can be processed at the on-site unit 22, and the processed data passed to the base unit 18. The base station control system is adapted to record the received information. The base station control system may also include a database indicating the particular user who is assigned to the particular RFPD 10. The base station control system (or on-site unit control system) may also be adapted to process the RFPD 10 information to determine the cumulative amounts of RF radiation exposure for a particular RFPD 10 (and therefore the cumulative RF radiation exposure of the assigned user) during a given period of time.

The base station control system may be further adapted to communicate the collected information (or information based on the collected information; e.g., processed information) back to the RFPD 10 to inform the RFPD user. As indicated above, the communications between the base unit 18 and the RFPD 10 may be direct, or may be indirect via an on-site unit 22. In addition, or alternatively, the base station control system may communicate the aforesaid information to an oversight entity, such as the owner or operator of the RF transmitting site 19, or the user's employer, or a regulatory entity, etc. The communication may be an active communication (e.g., where the information is sent) or a passive communication (e.g., an alert) that alerts the oversight entity to access the aforesaid information which is stored within the base station control system.

This information may inform the user or the oversight entity of the user's accumulated RF radiation exposure; e.g., as the user works around numerous RF radiation sites (e.g., cell antenna transmitters) in a single day, or week, or month. The ability to track a user's accumulated RF radiation exposure is important due to the cumulative effects of RF radiation exposure. The tracked accumulated RF radiation exposure data also allows an employer, or other regulatory agency to regulate, modify or change time and frequency of the user's visits to RF radiation sites in a given region. The RFPD 10 may be configured so that the accumulated RF radiation exposure data can be selectively reset; e.g., after the cumulative data is transferred to a base station, or to start a new monitoring period, etc.

The SPS 20, including the RFPDs 10 used in the SPS 20, may be configured so that when a user carrying an RFPD 10 enters an area where RF radiation exists (e.g., when it senses RF radiation), the RFPD 10 automatically activates and links up (directly or indirectly) with a remote base unit 18. This communication can enable an oversight entity the ability to monitor whenever a user is inside a restricted and/or controlled RF radiation area where the user may be exposed to RF radiation. The base unit 18 may be configured to send a warning (e.g., audible, vibration, visual, etc.) to the RFPD 10, thereby notifying the user of a potential RF radiation risk. This alarm feature provides a redundant fail-safe mechanism in the event the RFPD 10 exposure alarm malfunctions.

Alternatively the SPS 20, including the RFPDs 10 used in the SPS 20, may be configured so that when a user carrying an RFPD 10 enters an RF transmitting site 19, the RFPD 10 automatically activates and links up (directly or indirectly) with a remote base unit 18 regardless of whether the RF transmitting site 19 is actively producing RF radiation at that time. For example, if the RFPD 10 includes a GPS module, the RFPD control system 14 may be adapted to compare the GPS location data to information in a database indicating the location of RF transmitting sites 19. This functionality may alternatively be performed in the base unit control system. If the GPS location data indicates that the RFPD 10 is within a predetermined proximity to an RF transmitting site 19, then the RFPD 10 will communicate the same to the base unit 18, or vice versa. The base unit control system may use that information, for example, to inform the RF transmitting site operator who then may use that information in the decision making process of activating the RF transmitting site 19. Alternatively or in addition, the SPS 20 may be configured so that a base unit 18 periodically communicates a location query to associated RFPDs 10 seeking their location information, or on-site units 22 sense for the presence of an RFPD 10 at the particular site. The on-site units 22 may then send information regarding the presence of absence of RFPDs 10 at RF transmitting sites 19 back to the base unit 18. If the base unit 18 (directly or indirectly) determines that an RFPD 10 is present at an RF transmitting site 19, then that information can be used in the decision making process of activating the respective RF transmitting site 19, including sending a warning message to the RFPD 10 informing the user that the RF transmitting site 19 will become active.

In some embodiments, the RFPD 10 may be a "dumb" device that may be sensed by a base unit (directly or indirectly). For example in those embodiments that include on-site units 22, the RFPD 10 may be configured in a manner that can be detected by the on-site unit 22 indicating that the RFPD 10 is present at the RF transmitting site 19. Once an RFPD 10 is identified as being present at the RF transmitting site 19, the control system of the on-site unit 22 can initiate collection of RF radiation information (e.g., the time and date when the RF exposure occurred, the duration of RF exposure, and the level of RF radiation to which the RFPD 10 was exposed occurred), which information can then be transferred to a base unit 18. An example of a "dumb" RFPD 10 that can be sensed is a cellphone. In this instance, the presence of a cellphone at an RF transmitting site 19 can be sensed based on the features of the cellphone (e.g., the cellphone receiving or seeking cellular connection). The very high percentage of people today who carry cellphones and the ability to associate a particular phone with a person (e.g., via the phone's electronic serial number, or SIM card), makes this type of "dumb" RFPD 10 a very effective tool within an SPS 20. This is particularly true for detecting intruders at an RF transmitting site 19. In addition, the ability to identify the presence of specific person at an RF transmitting site 19 via their cellphone, also may allow for an oversight entity (e.g., a police or fire authority) to contact the cellphone holder to alert him that there may be an RF radiation danger that he may not be otherwise aware of.

The SPS 20 may include one or more image recording devices (e.g., video, photograph, etc.) to permit image monitoring of the site 19; e.g., to capture images of a user (or trespasser) present at the site 19. The image collection aspect of the SPS 20 can be configured to collect and record the imagery for subsequent review, and/or collect and send the imagery for real time observation of the imagery; e.g., at the base unit 18. The image recording device may be triggered by an RFPD 10 entering the RF transmitting site 19; e.g., the presence of a cellphone or other transmitting device at the RF transmitting site 19.

The information or imagery relating to the presence of an RFPD 10 at an RF transmitting site 19, or the presence of a trespasser at the site, may also facilitate oversight of individuals present at an RF transmitting site 19; e.g., allow an employer to track the presence of an employee when the employee conducts his work activity at a particular site 19.

The SPS 20 (e.g., via a base unit control system) may be configured to provide a warning (e.g., visual, audible, etc.) at an RF transmitting site 19; e.g., if a high RF radiation level at the RF transmitting site 19 is detected, or if an RFPD 10 indicates a user is at or above a collective RF radiation exposure level, or if an unauthorized person is present at the site 19. The SPS 20 may also provide such a visual and/or audible indication if the user is not wearing appropriate RF radiation protective equipment/clothing.

The SPS 20 may include sensors (e.g., motion detectors, thermal imaging devices, optical devices, audible sensing devices, etc.) to detect human presence at an RF transmitting site 19. The SPS 20 could be adapted to determine whether a person is authorized to be at an RF transmitting site 19. For example, if the SPS 20 senses an RFPD 10, the SPS 20 could make a determination regarding whether the person to which the RFPD 10 is assigned has the authority to be at the RF transmitting site 19; e.g., authority tracks with the person assigned to the RFPD 10. If the SPS 20 includes sensors for detecting human presence at the RF transmitting site 19, the SPS 20 could then be adapted to determine the presence of an RFPD 10. If no RFPD 10 is present at that time, an alarm signal may be sent to a remote location (e.g., a base station, or third party policing authority).

The SPS 20 (via a base unit control system) may be adapted to contact emergency authorities (e.g., police, fire, etc.) or other predetermined response actions. For example, the SPS 20 may be adapted to shut down an RF transmitter site if certain events occur (e.g., trespasser present, continued presence of RFPD holder beyond safety limits, etc.) The SPS 20 may also be adapted to communicate with RF transmitter control authority regarding event status.

According to another aspect of the present invention, a user wearable protective device is provided that may be worn on the head of a user. The wearable protective device may include materials that absorb RF radiation, or may include geometric features that absorb or reflect RF radiation (e.g., sharp angle features like those used in radar stealth aircraft or naval vessel design). The device may include a face visor portion configured to absorb and/or reflect RF transmissions (e.g., via materials and/or geometry) but is transparent to permit vision. In some embodiments, the device is configured so that the visor can be raised above the head when the user leaves an area where RF transmissions may exist.

What is claimed is:

1. A method of monitoring a radiofrequency ("RF") transmitting site, comprising:
   providing at least one on-site unit located at the RF transmitting site, and a base unit located remote from the RF transmitting site;
   using the on-site unit to sense the presence of a cell phone located at the RF transmitting site, by sensing for signals emitted by the cell phone, and which sensing does not utilize communication from the on-site unit to the cell phone at the RF transmitting site;
   using the at least one on-site unit to sense RF radiation at the RF transmitting site once the presence of the cell phone at the RF transmitting site is determined, including determining a level of the sensed RF radiation; and
   using the on-site unit to communicate the presence of the cell phone at the RF transmitting site to the base unit.

2. The method of claim 1, further comprising using at least one of the on-site unit or the base unit to determine a period of time the cell phone is present at the RF transmitting site.

3. The method of claim 2, further including using at least one of the base unit or the on-site unit to determine a total amount of the sensed RF radiation sensed by the on-site unit during the period of time the cell phone is present at the RF transmitting site.

4. The method of claim 1, wherein the cell phone includes an RF radiation sensing device.

5. The method of claim 4, wherein the cell phone includes at least one processor in communication with the RF radiation sensing device, and a software application stored in a memory device in communication with the processor, which software application includes instructions executable by the processor, wherein the instructions when executed cause the processor to determine a level of RF radiation sensed by the RF radiation sensing device portion of the cell phone.

6. The method of claim 5, wherein the instructions when executed further cause the processor to determine a period of time the RF radiation sensing device portion of the cell phone senses the RF radiation.

7. The method of claim 5, wherein the instructions when executed further cause the processor to determine a total amount of the RF radiation sensed by the RF radiation sensing device portion of the cell phone.

* * * * *